(12) United States Patent
Gogineni et al.

(10) Patent No.: US 11,848,292 B2
(45) Date of Patent: Dec. 19, 2023

(54) PAD DESIGN FOR THERMAL FATIGUE RESISTANCE AND INTERCONNECT JOINT RELIABILITY

(71) Applicant: Intel Corporation, Santa Clara, CA (US)

(72) Inventors: Sireesha Gogineni, Folsom, CA (US); Yi Xu, Folsom, CA (US); Yuhong Cai, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 1117 days.

(21) Appl. No.: 16/158,061

(22) Filed: Oct. 11, 2018

(65) Prior Publication Data

US 2020/0118955 A1 Apr. 16, 2020

(51) Int. Cl.
*H01L 23/00* (2006.01)

(52) U.S. Cl.
CPC .............. *H01L 24/05* (2013.01); *H01L 24/03* (2013.01); *H01L 24/16* (2013.01);
(Continued)

(58) Field of Classification Search
CPC ......... H01L 24/05; H01L 24/03; H01L 24/16; H01L 2224/0361; H01L 2224/0401; H01L 2224/05557; H01L 2224/16227; H01L 2924/15323; H01L 23/49816; H01L 23/49811; H01L 24/13; H01L 2224/03632; H01L 2224/03831; H01L 2224/0384; H01L 2224/05567; H01L 2224/13022; H01L 2224/13144; H01L 2224/05647; H01L 2224/13147; H01L 2224/1329; H01L 2224/133; H01L 2224/1607;
(Continued)

(56) References Cited

U.S. PATENT DOCUMENTS

| 5,926,694 A * | 7/1999 | Chigawa | ................. H01L 24/83 257/E21.503 |
| 6,287,950 B1 * | 9/2001 | Wu | ......................... H01L 24/03 257/E21.508 |

(Continued)

FOREIGN PATENT DOCUMENTS

WO WO-2006097779 A1 * 9/2006 ....... H01L 23/49816

*Primary Examiner* — Douglas W Owens
(74) *Attorney, Agent, or Firm* — Schwabe, Williamson & Wyatt, P.C.

(57) ABSTRACT

Embodiments described herein provide techniques for forming an interconnect structure that includes micro features formed therein. Such embodiments can assist with improving interconnect joint reliability when compared to conventional pads that have a flat surface. An interconnect structure may comprise: a metal pad over a substrate (e.g., a semiconductor package, a PCB, an interposer, etc.). Micro features may be formed in an edge of the metal pad or away from the edge of the metal pad. The micro features can assist with: (i) increasing the contact area between solder used to form an interconnect joint and the metal pad; and (ii) improving adherence of solder used to form an interconnect joint to the metal pad. These benefits can improve interconnect joint reliability by, among others, improving the interconnect joint's ability to absorb stress from substrates having differing coefficients of thermal expansion.

25 Claims, 8 Drawing Sheets

(52) U.S. Cl.
CPC ............... *H01L 2224/0361* (2013.01); *H01L 2224/0401* (2013.01); *H01L 2224/05557* (2013.01); *H01L 2224/16227* (2013.01); *H01L 2924/15323* (2013.01)

(58) Field of Classification Search
CPC . H01L 2224/16238; H01L 2224/81191; H01L 2224/81385; H01L 2224/81815; H05K 3/4007; H05K 1/111; H05K 3/3436
See application file for complete search history.

(56) References Cited

U.S. PATENT DOCUMENTS

| | | | | |
|---|---|---|---|---|
| 6,437,429 | B1* | 8/2002 | Su | H01L 24/97 257/784 |
| 10,622,785 | B2* | 4/2020 | Yoon | H01S 5/023 |
| 11,239,185 | B2* | 2/2022 | Gutierrez, III | H01L 23/5226 |
| 2003/0234447 | A1* | 12/2003 | Yunus | H05K 1/111 257/739 |
| 2010/0044884 | A1* | 2/2010 | Zbrzezny | H01L 23/49816 257/E21.59 |
| 2011/0101519 | A1* | 5/2011 | Hsiao | H01L 23/49827 257/737 |
| 2014/0117532 | A1* | 5/2014 | Chuang | H01L 24/13 257/737 |
| 2016/0104685 | A1* | 4/2016 | Shen | H01L 24/16 257/737 |
| 2016/0351520 | A1* | 12/2016 | Jiang | H01L 24/13 |
| 2018/0269177 | A1* | 9/2018 | Yang | H01L 24/80 |

* cited by examiner

PAD DESIGN FOR THERMAL FATIGUE RESISTANCE AND INTERCONNECT JOINT RELIABILITY

BACKGROUND

Field

Embodiments described herein generally relate to substrates (e.g., semiconductor packages, printed circuit boards (PCB), etc.). More particularly, but not exclusively, embodiments described herein relate to an interconnect structure that is on or part of a substrate.

Background Information

At least one packaged system includes a semiconductor package coupled to a PCB. Pressures to improve the performance capabilities of these systems have caused the number of semiconductor dies in a semiconductor package to increase over time. One example of such a package is a package comprised of stacked dies (e.g., memory dies, etc.). Dies are formed from silicon. Hence, as dies in a package increase, the amount of silicon in the package also rises. Increasing silicon in a package, however, reduces the package's overall coefficient of thermal expansion (CTE).

The pressures alluded to above have also led to increased input/output (I/O) density in PCBs, which results from increasing I/O features (e.g., traces, etc.) in PCBs. I/O features are formed from metallic materials (e.g., copper, etc.). Therefore, as I/O density in a PCB increases, the metallic materials in the PCB also increase. However, increasing the amount of metallic materials in a PCB increases the PCB's overall CTE.

The reducing CTEs of semiconductor packages and the increasing CTEs of PCBs is increasing the CTE mismatches between these devices. CTE mismatches create stress between interconnect joints coupling packages and PCBs. Such stress can curtail the reliable functioning of a packaged system because the stress may damage the interconnect joints. Thus, interconnect joints between packages and PCBs need to be designed to absorb stress caused by CTE mismatches between packages coupled to PCBs.

An interconnect joint is usually formed on two interconnect structures (e.g., pads, etc.). For example, a first pad on a package is coupled to a second pad on a PCB using reflowed solder (e.g., a ball grid array (BGA) solder ball, etc.). A conventional interconnect structure has a flat surface. Adherence of solder used to form an interconnect joint to the conventional interconnect structure is limited. This is because the flat surface of the conventional interconnect structure has a limited surface area. The limited adherence can reduce reliability of the subsequently formed interconnect joint because the joint may be incapable of absorbing stress affecting coupled substrates. For example, the unabsorbed stress can cause cracks in the interconnect joint, cratering of the interconnect structure, etc.

CTE mismatches are prevalent in areas where an interconnect structure, solder, and other features (e.g., a solder mask, etc.) are in contact. Such mismatches are due to differing CTEs of materials used to form the interconnect structure, the solder, and the other features. These CTE mismatches create stress that can affect the interconnect structure, the solder, or the other materials. Due to the limited adherence described above, the interconnect joint and/or the interconnect structure may be incapable of absorbing the stress caused by CTE mismatches, which can in turn damage the interconnect joint and/or the interconnect structure.

Traditionally, underfill materials or glues have been used to improve interconnect joint reliability. These techniques, however, have some drawbacks. Using an underfill material to improve interconnect joint reliability includes distributing the underfill material from an edge region of a substrate to all other regions of the substrate. In this way, the interconnect joint is encapsulated by the underfill material. In order to achieve an acceptable distribution, the underfill material is formed from specialized materials, which are costly to design and manufacture. A glue can also be used to improve interconnect joint reliability, however, glue is only applied to predetermined locations on a substrate, such as around the interconnect joint. Similar to the underfill materials, glues can be costly to design and manufacture. Another drawback of using underfill materials and glues is suboptimal control during semiconductor manufacturing and packaging processes. Also, use of underfill materials and glues limits solder rework due to costs associated with manipulating previously applied underfill materials or glues on interconnect joints. Additionally, use of underfill materials and glues adds to the CTE mismatches between substrates, which can reduce interconnect joint reliability. Consequently, some existing techniques for improving interconnect joint reliability are suboptimal.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

DETAILED DESCRIPTION

Figure 1A:
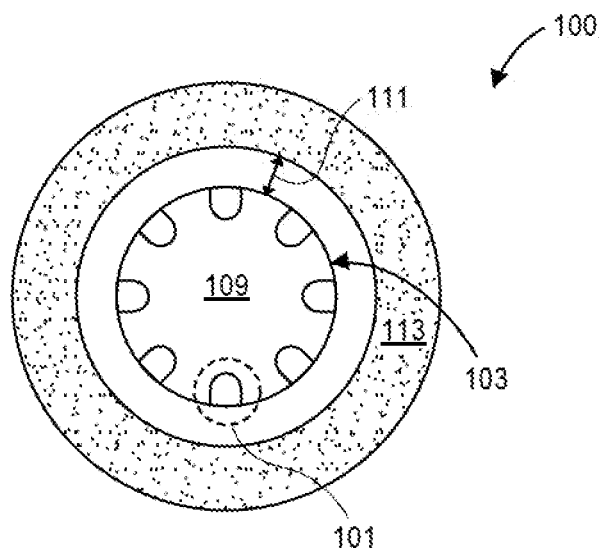
FIG. 1A is a plan view illustration of an interconnect structure that includes a non-solder mask defined (NSMD) pad and micro features formed in the NSMD pad, in accordance with an embodiment.

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "over", "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein provide techniques for forming an interconnect structure that assists with improving interconnect joint reliability when compared to conventional techniques. More specifically, embodiments of the interconnect structure described herein can assist with one or more of: increasing the ability of an interconnect joint to absorb stress caused by CTE mismatches, as described above; minimizing or eliminating one or more of the drawbacks associated with underfill materials and glues, as described above; and minimizing or eliminating the need to use underfill materials or glues to improve interconnect joint reliability.

Embodiments of the interconnect structure described herein can be conceptually understood as a pad having micro features formed in at least one surface of the pad. The micro features assist with increasing adherence of solder or any other suitable material to the interconnect structure (when compared to the limited adherence associated with flat interconnect structures, as described above). Stated differently, the micro features provide increased surface area between the interface of the interconnect joint and the pad, which in turn increases adherence of the solder used to form the interconnect joint to the pad. As a result, the interconnect joint conforms to a profile of the micro feature. An interconnect joint formed on one or more embodiments of the interconnect structures described herein can provide, among others, one or more of the benefits described above.

In an embodiment, an interconnect structure may comprise a metal pad over a substrate. The metal pad may have two surfaces: a top surface and a bottom surface. A micro feature may be formed as a recess in the top surface or by removing a portion of the metal pad that includes the top and bottom surfaces. The micro feature can have any shape (e.g., a circle, a polygon, an ellipse, etc.), be formed as a line segment (curved line segment, straight line segment, etc.), or any combination thereof. For example, the micro feature can be a combination of a circle and a polygon, a circle and a line segment, etc. In an embodiment, the metal pad with micro features formed therein may be formed with subtractive processes (e.g., etching one or more metal layers on a substrate, etc.). In one embodiment, the metal pad is a solder mask defined (SMD) pad. In another embodiment, the metal pad is a non-solder mask defined (NSMD) pad.

Referring now to FIG. 1A, a plan view illustration of an interconnect structure 100 is shown, in accordance with an embodiment. The interconnect structure 100 comprises a metal pad 109 on a substrate (not shown in FIG. 1A). The metal pad 109 may be formed from copper, any other suitable conductive/metallic material, or any combination of conductive/metallic materials. The metal pad 109 is an NSMD pad—that is, a metal pad that is designed such that solder mask 113 around the metal pad 109 does not make contact with the metal pad 109. The solder mask 113 is created such that a gap 111 is created between the edge 103 of the metal pad 109 and the solder mask 113. As shown, the metal pad 109 includes micro features 101 formed in an edge 103 of the metal pad 109. The micro features 101 may be formed as recesses. The micro features 101 provide increased surface area between the interface of the solder used to form an interconnect joint on the metal pad 109, which in turn increases adherence of the solder used to form the interconnect joint to the metal pad 109. As a result, the interconnect joint conforms to a profile of the micro features 101.

Figure 1B:
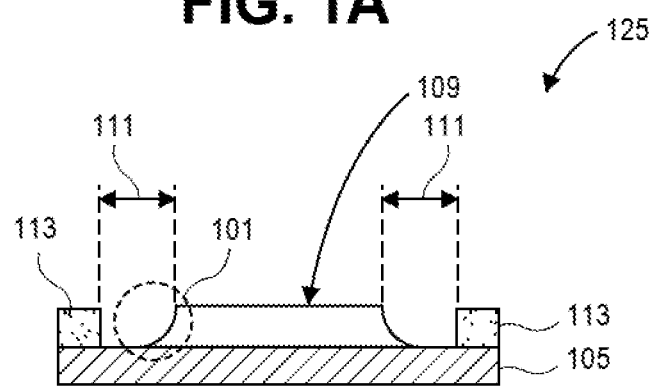
FIGS. 1B-1C are cross sectional side view illustrations of embodiments of an interconnect structure that includes an NSMD pad and micro features formed in the NSMD pad.

Moving on to FIG. 1B, a cross-sectional side view illustration of an interconnect structure 125 is shown, in accordance with an embodiment. The interconnect structure 125 may be similar to or the same as the structure 100 described above in connection with FIG. 1A. The interconnect structure 125 includes a metal pad 109 and a solder mask 113 on a substrate 105. A gap 111 separates the pad 113 from the solder mask 113 around the metal pad 109. The substrate 105 can be any substrate known in the art (e.g., a semiconductor package, a PCB, an interposer, etc.). The substrate 105 can be formed from an inorganic material, an organic material, or any combination thereof. The substrate 105 can be a cored or coreless substrate.

The metal pad 109 has micro features 101 formed therein. As shown, the micro features 101 are recesses formed by removing portions of the edge of the metal pad 109 that include top and bottom surfaces of the metal pad 109. Thus, a thickness (e.g., a z-height, etc.) of the micro features 101 is substantially equal to a thickness of the metal pad 109. For example, the removed portion may extend from the top surface to the bottom surface such that the micro features 101 are in contact with a top surface of the substrate 105.

The micro features 101 may be fabricated to have any shape (e.g., a circle, a semi-circle, an ellipse, a polygon, etc.). In FIG. 1B, the micro features 101 exhibit a curved profile. Other embodiments, however, are not so limited. For example, the micro features 101 may exhibit a square profile, a sloped profile, or any other known profile, etc. In an embodiment, the metal pad 109 is an NSMD pad.

Figure 1C:
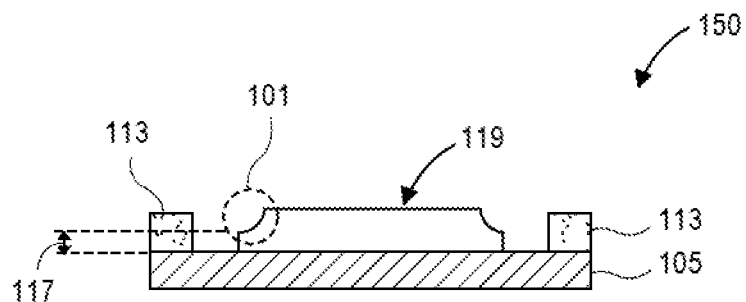

Referring now to FIG. 1C, a cross-sectional side view illustration of an interconnect structure 150 is shown, in accordance with another embodiment. The interconnect structure 150 may be similar to or the same as the structure 100 described above in connection with FIG. 1A. Furthermore, the interconnect structure 150 is the same as the interconnect structure 125 of FIG. 1B, with the exception that the micro features 101 of structure 150 are formed by removing portions of the edge of the metal pad 119 that include the top surface of the metal pad 119 (not the top and bottom surfaces of the metal pad 119). As such, the micro features 101 are formed above the substrate at a z-height 117. In one embodiment, the z-height 117 is less than a total thickness of the metal pad 119.

Figure 2A:
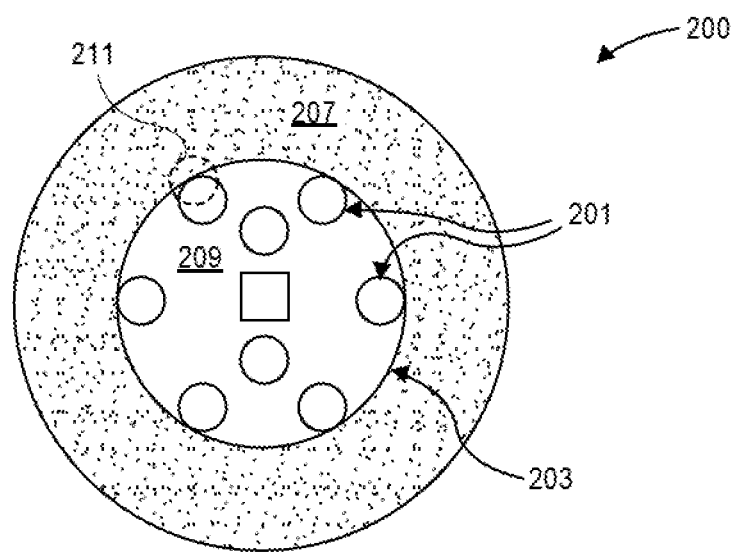
FIG. 2A is a plan view illustration of an interconnect structure that includes a solder mask defined (SMD) pad and micro features formed in the SMD pad, in accordance with an embodiment.

With regard now to FIG. 2A, a plan view illustration of an interconnect structure 200 is illustrated. The structure 200 includes a metal pad 209 that is surrounded by a solder mask 207, where the metal pad 209 and the solder mask 207 are on a substrate (not shown in FIG. 2A). The metal pad 209 is an SMD pad, which is a type of pad that has its solder mask 207's opening 203 specified such that the opening 203 in the solder mask 207 is smaller than the diameter of the metal pad 209 covered by the solder mask 207. In this way, the size of the metal pad 209 where an interconnect joint will be formed is effectively reduced.

As shown in FIG. 2A, the metal pad 209 includes micro features 201 formed in a top surface of the metal pad 209. The micro features 201 may be formed as recesses in the metal pad 209 and may have any shape known in the art (e.g., a circle, a semi-circle, an ellipse, a polygon, etc.). A thickness of the micro features 201 may be less than or equal to a thickness of the metal pad 209.

In one embodiment, at least one of the micro features 201 is formed in a location 211 under the opening 203 proximate to an interface between the solder mask and the metal pad. For example, a location under the opening 203 where the metal pad 209 and the solder mask 207 are in contact. These micro features 201 can assist with reducing the stress caused by CTE mismatches between the metal pad 209, the solder mask 207, and solder that is subsequently applied for forming an interconnect joint.

In one embodiment, at least one of the micro features 201 is formed in a center region of the metal pad 209 away from the edge of the metal pad 209. These micro features 201 can assist with increasing adherence of solder or any other suitable material to the interconnect structure (when compared to the limited adherence associated with conventional interconnect structures). Consequently, the increased adherence assists with: increasing the ability of an interconnect joint formed on the metal pad 209 to absorb stress caused by CTE mismatches, as described above; minimizing or eliminating one or more of the drawbacks associated with underfill materials and glues, as described above; and minimizing or eliminating the need to use underfill materials or glues to improve interconnect joint reliability.

Figure 2B:
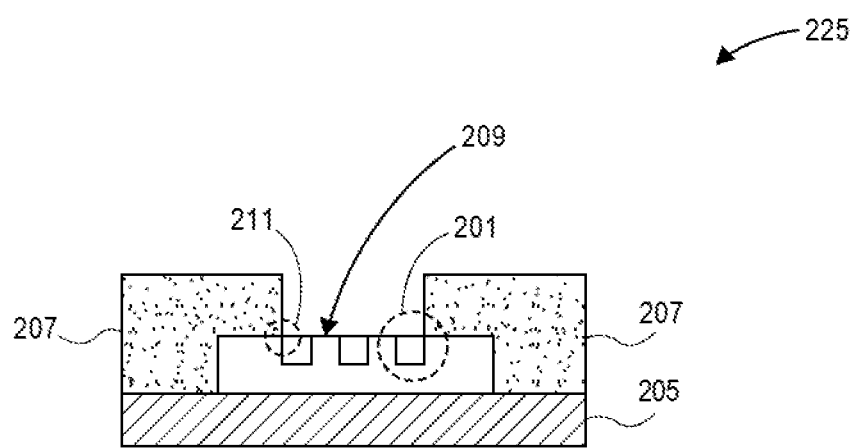
FIG. 2B is a cross sectional side view illustration of an embodiment of an interconnect structure that includes an SMD pad and micro features formed in the SMD pad.

Moving on to FIG. 2B, a cross-sectional side view illustration of an interconnect structure 225 is shown. The interconnect structure 225 can be similar to or the same as the structure 200 described above in connection with FIG. 2A. The structure 225 is similar to the structure 200 described above, with the exception that a substrate 205 is shown. The substrate 205 can be similar to or the same as the substrate 105 described above in connection with FIGS. 1B-1C. In one embodiment, at least one of the micro features 201 is located 211 under the opening 203 proximate to an interface between the solder mask 207 and the metal pad 209. For example, this location 211 may be where the metal pad 209 and the solder mask 207 are in contact. Due to the close proximity of the metal pad 209 to the solder mask 207 in the location 211, CTE mismatches caused by the differing CTEs of the metal pad 209 and the solder mask 207 are likely to occur. The CTE mismatches can cause unwanted stress at the location 211. However, the presence of the micro features 201 can assist with alleviating this stress by enabling adherence of solder used to form an interconnect joint on the metal pad 209 to be coupled more securely than when compared to a conventional pad that lacks the micro features 201.

Figure 3A:
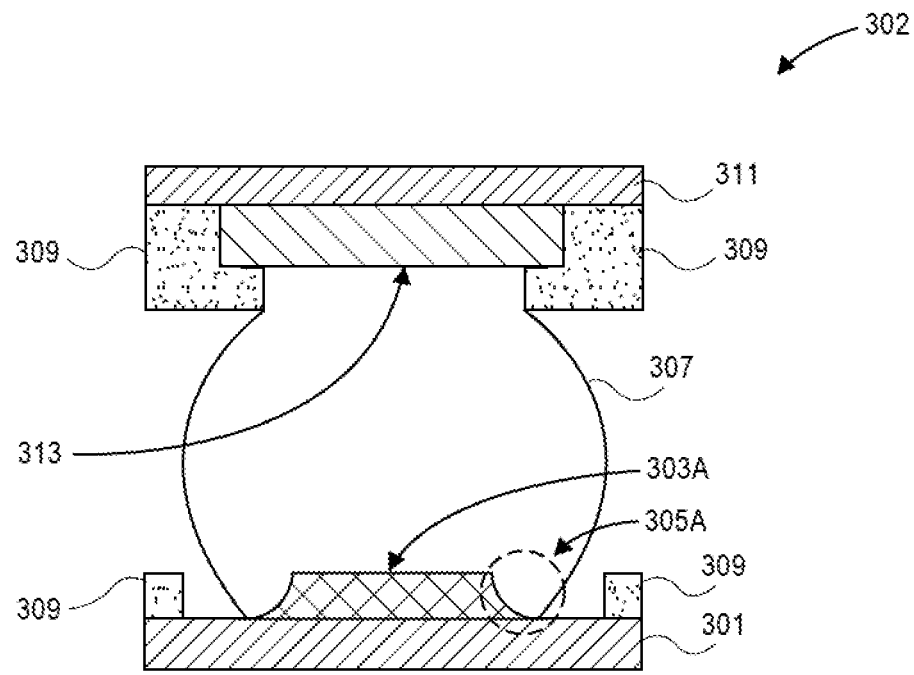
FIGS. 3A-3E are cross sectional illustrations of embodiments of a pad having micro features formed therein and an interconnect joint.

FIG. 3A is a cross sectional side view illustration of an interconnect structure 302 that includes an NSMD pad 303A with micro features 305A formed therein and an interconnect joint 307, in accordance with one embodiment. The structure 302 comprises a substrate 301, an NSMD pad 303A having micro features 305A formed therein on the substrate 301, an interconnect joint 307, a substrate 311, a conventional SMD pad 313 on the substrate 311, and a solder mask 309 on the substrates 301 and 311.

The interconnect structure 302 shown in FIG. 3A may assist with improving interconnect joint reliability when compared to conventional interconnect structures that comprise NSMD pads. For example, the interconnect structure 302 can assist with minimizing or eliminating one or more of the drawbacks associated with underfill materials and glues, as described above. In some scenarios, the interconnect structure 302 can enable creation of interconnect joints 307 that do not need underfill or glues to improve interconnect joint reliability. Also, the structure 302 can assist with increasing the ability of an interconnect joint 307 formed on the NSMD pad 303A to absorb stress caused by CTE mismatches, as described above. The benefits associated with the structure 302 are due to an increased adherence of the solder used to form the interconnect joint 307 to the NSMD pad 303A. A conventional interconnect structure lacks a pad with micro features formed therein, and as a result, this conventional interconnect structure only allows for limited adherence of solder to the pad. This limited adherence degrades interconnect joint reliability because the limited adherence causes the interconnect joint to fail to absorb stresses caused by CTE mismatches, which can cause damage to the interconnect joint or cause cratering of the pad. In contrast, the micro features 305A allow for more adherence of solder to the NSMD pad 303A (when compared to a conventional pad that lacks micro features). This increased adherence is attributable to the micro features 305A formed in the edge of the NSMD pad 303A by removing or etching away portions of the NSMD pad 303A's top and bottom surfaces. This increased adherence enhances solder wicking around the NSMD pad 303A, which in turn assists with reducing stress concentration and increasing the overall portions of the NSMD pad 303A in contact with solder for improved thermal fatigue resistance and interconnect joint reliability. The benefits described above can assist with reducing costs associated with semiconductor packaging and manufacturing and with facilitating increased control over processes used in semiconductor packaging and manufacturing. Reductions in cost and increased control over processes can in turn reduce failure rates of interconnect joints, which can in turn assist with improving life cycles of packages, PCBs, and electronic devices.

Each of the substrate 301 and the substrate 311 can be any known substrate (e.g., a semiconductor package, a PCB, an interposer, etc.). Although not shown in FIG. 3A, a semiconductor die having a pad could replace the substrate 311 and the conventional SMD pad 313. Each of the pads NSMD 303A and conventional SMD 313 may be formed from a conductive material (e.g., copper, etc.). The interconnect joint 307 may be formed from any suitable material (e.g., solder, gold, conductive epoxy, copper, any combination thereof, etc.). For example, a solder paste may be deposited between the NSMD pad 303A and the conventional SMD pad 313, and reflowed to form the interconnect joint 307. The joint 307 permanently couples the NSMD pad 303A and the conventional SMD pad 313 to each other, so that the substrates 301 and 311 are coupled to each other. The micro features 305A are formed in the top and bottom surfaces of the NSMD pad 303A. More specifically, the micro features 305A extend from the top surface of the NSMD pad 303A to the bottom surface of the NSMD pad 303A such that the micro features 305A are in contact with the top surface of the substrate 301. Thus, the micro features 305A exhibit a thickness that is substantially equal to a thickness of the NSMD pad 303A. This enables solder used to form the interconnect joint 307 to adhere more closely to the NSMD pad 303A by conforming to the profile of the micro features 305A (when compared to how solder used to form a conventional interconnect joint adheres a conventional pad lacking the micro features 305A).

Figure 3B:
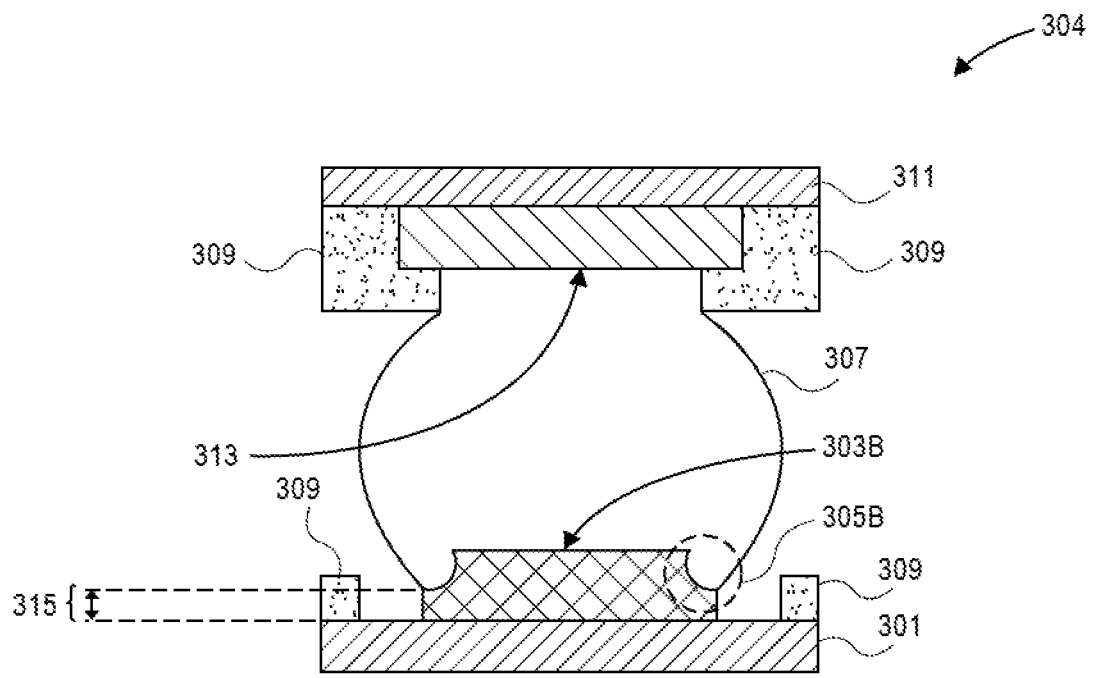

Moving on to FIG. 3B, a cross sectional side view of an interconnect structure 304 that includes an NSMD pad 303B having micro features 305B formed therein and an interconnect joint 307 is shown. The interconnect structure 304 shown in FIG. 3B is similar to the structure 302 shown in FIG. 3A, with the exception that the micro features 305B shown in FIG. 3B are formed in the top surface of the metal pad 303B (instead of in both the top and bottom surfaces). As shown, the micro features 305B are formed at a z-height 315 that is less than a thickness of the metal pad 303B.

Figure 3C:
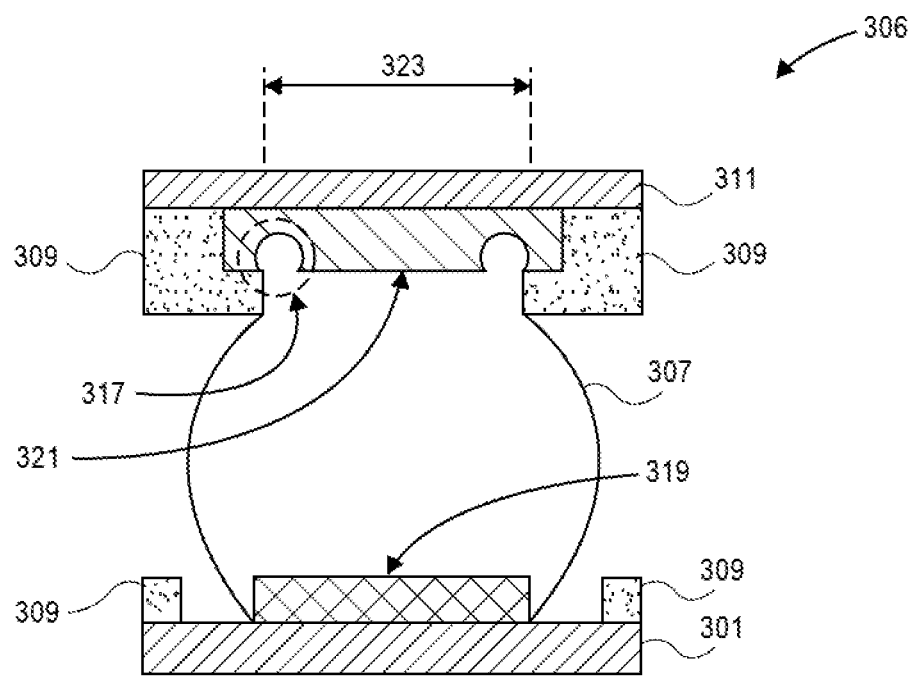

Regarding FIG. 3C, a cross sectional side view of an interconnect structure 306 that includes an SMD pad 321 having micro features 317 formed therein and an interconnect joint 307 is shown. The interconnect structure 306 shown in FIG. 3C is similar to the structure 302 shown in FIG. 3A, with the exception that the SMD pad 321 includes micro features formed in the surface of the SMD pad 321 and that the NSMD pad 319 is a conventional NSMD pad.

The interconnect structure 306 shown in FIG. 3C may assist with improving interconnect joint reliability when compared to conventional interconnect structures that comprise SMD pads. For example, the interconnect structure 306 exhibits increased adherence of solder to the SMD pad 321, which in turn provides the same benefits as those described above in connection with FIGS. 2A, 2B, and 3A. The increased adherence of solder to the SMD pad 321 is attributable to the micro features 317 formed away from the edge of the SMD pad 321 by removing or etching away portions of the SMD pad 321's bottom surface. The micro features 317 may have a thickness that is less than or equal to a thickness of the SMD pad 321.

In one embodiment, at least one of the micro features 317 is formed in the SMD pad 321 under the opening 323 in a location proximate to an interface between the SMD pad 321, the solder used to form the joint 307, and the solder mask 309. For example, in a location where the pad 321, the solder used to form joint 307, and the solder mask 309 are in contact. In this way, the micro features 317 can assist with absorbing stresses caused by CTE mismatches resulting from the differing CTEs of the SMD pad 321, the solder used to form joint 307, and the solder mask 309. Additionally, the increased adherence enhances solder wicking into the SMD pad 321, which has several benefits, as described above.

Figure 3D:
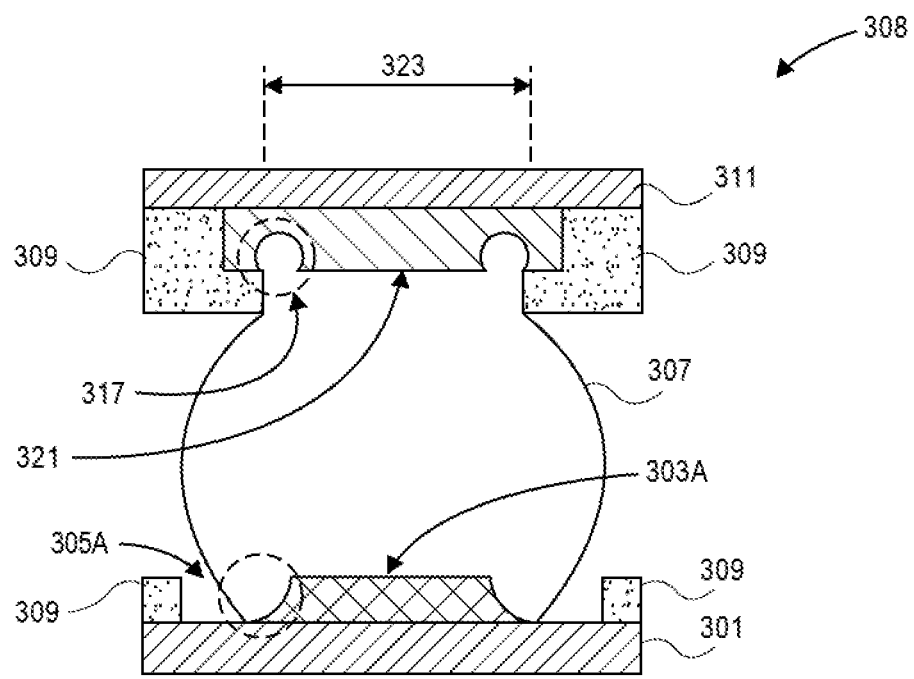

FIG. 3D illustrates a cross sectional side view of an interconnect structure 308 that includes an SMD pad 321 having micro features 317 formed therein, an NSMD pad 303A having micro features 305A formed therein, and an interconnect joint 307. Each of the SMD pad 321, the NSMD pad 303A, and the interconnect joint 307 are described above in connection with at least one of FIGS. 3A-3C.

Figure 3E:
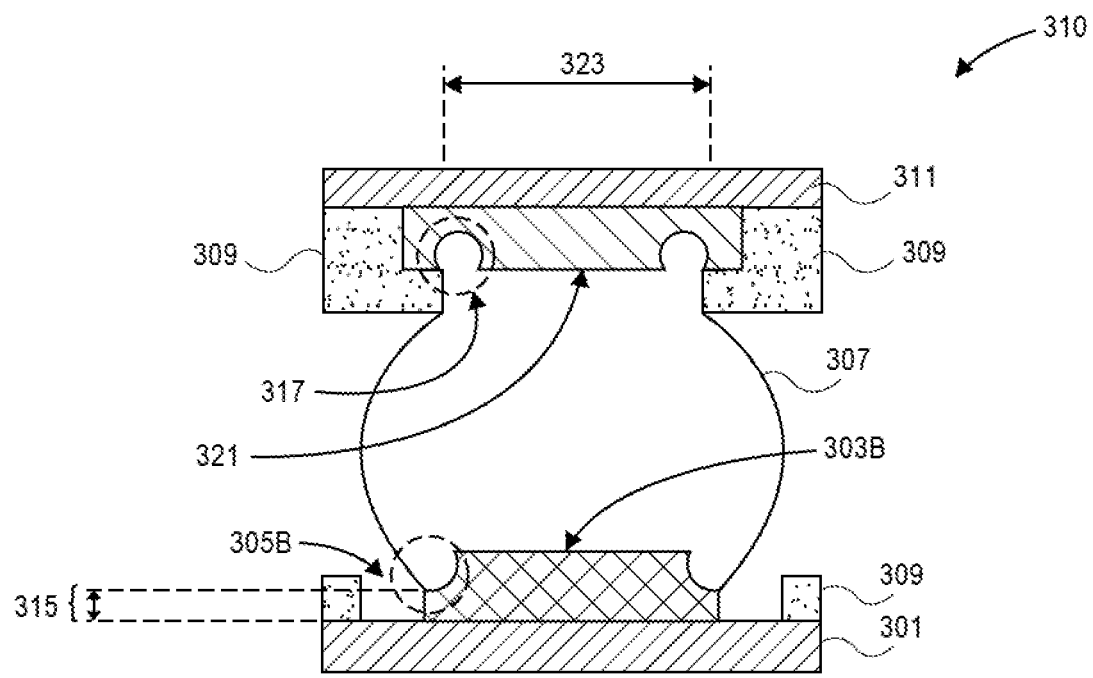

FIG. 3E illustrates a cross sectional side view of an interconnect structure 310 that includes an SMD pad 321 having micro features 317 formed therein, an NSMD pad 303B having micro features 305B formed therein, and an interconnect joint 307. Each of the SMD pad 321, the NSMD pad 303B, and the interconnect joint 307 are described above in connection with at least one of FIGS. 3A-3C.

Figure 4A:
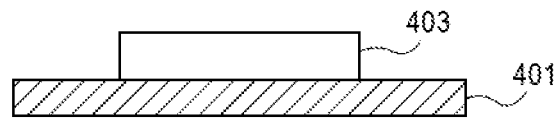
FIGS. 4A-4B illustrate a method of forming an NSMD pad having micro features formed therein in accordance with one embodiment.
Figure 4B:
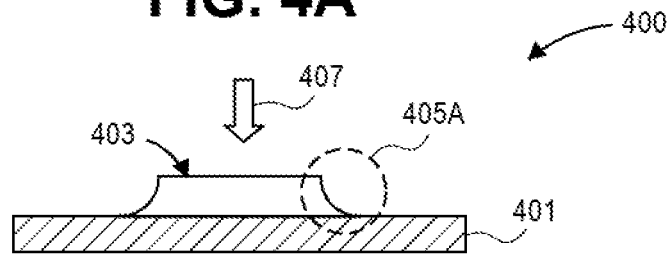

FIGS. 4A-4B illustrate a method of forming an interconnect structure 400 that includes a metallic structure 403 having micro features 405A formed therein, in accordance with one embodiment. Beginning with FIG. 4A, a metallic structure 403 (e.g., one or more metal layers, etc.) is deposited on a substrate 401. Next, the metallic structure 403 may be etched. For example, and as shown in FIG. 4B, laser etching 407 may be used to remove a portion of the metallic structure 403. The etching can be controlled to modify the metallic structure 403. Specifically, the etching is controlled to form micro features 405A at an edge of the metallic structure 403 by removing a portion of the metallic structure 403's top surface such that the micro features 405A are not in contact with the substrate 401.

Figure 5A:
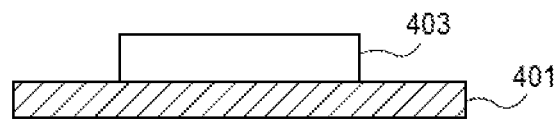
FIGS. 5A-5B illustrate a method of forming an NSMD pad having micro features formed therein in accordance with another embodiment.
Figure 5B:
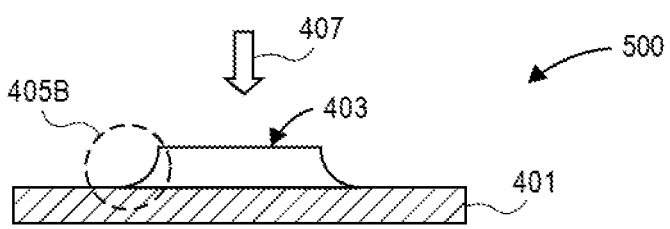

FIGS. 5A-5B illustrate a method of forming an interconnect structure 500 that includes a metallic structure 403 having micro features 405B formed therein, in accordance with one embodiment. Beginning with FIG. 5A, a metallic structure 403 (e.g., one or more metal layers, etc.) is deposited on a substrate 401. Next, the metallic structure 403 may be etched. For example, and as shown in FIG. 5B, laser etching 407 may be used to remove a portion of the metallic structure 403. The etching can be controlled to modify the metallic structure 403. Specifically, the etching is controlled to form micro features 405B at an edge of the metallic structure 403 by removing a portion of the metallic structure 403's top surface such that the micro features 405A are in contact with the substrate 401.

Figure 6A:
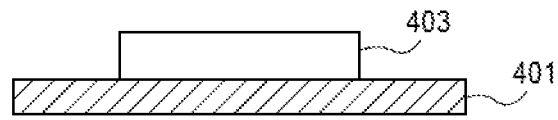
FIGS. 6A-6B illustrate a method of forming an SMD pad having micro features formed therein in accordance with one embodiment.
Figure 6B:
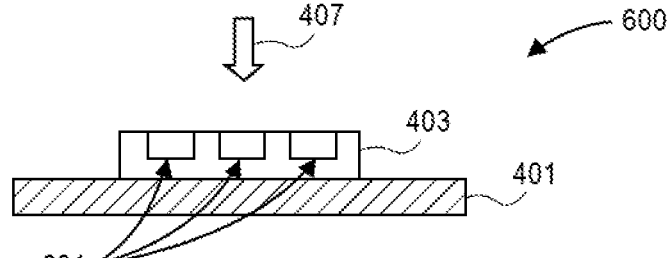

FIGS. 6A-6B illustrate a method of forming an interconnect structure 600 that includes a metallic structure 403 having micro features 601 formed therein, in accordance with one embodiment. Beginning with FIG. 6A, a metallic structure 403 (e.g., one or more metal layers, etc.) is deposited on a substrate 401. Next, the metallic structure 403 may be etched. For example, and as shown in FIG. 6B, laser etching 407 may be used to remove a portion of the metallic structure 403. The etching can be controlled to modify the metallic structure 403. Specifically, the etching is controlled to form micro features 601 away from an edge of the metallic structure 403 by removing a portion of the metallic structure 403's top surface such that the micro features 601 are not in contact with the substrate 401.

Figure 7:
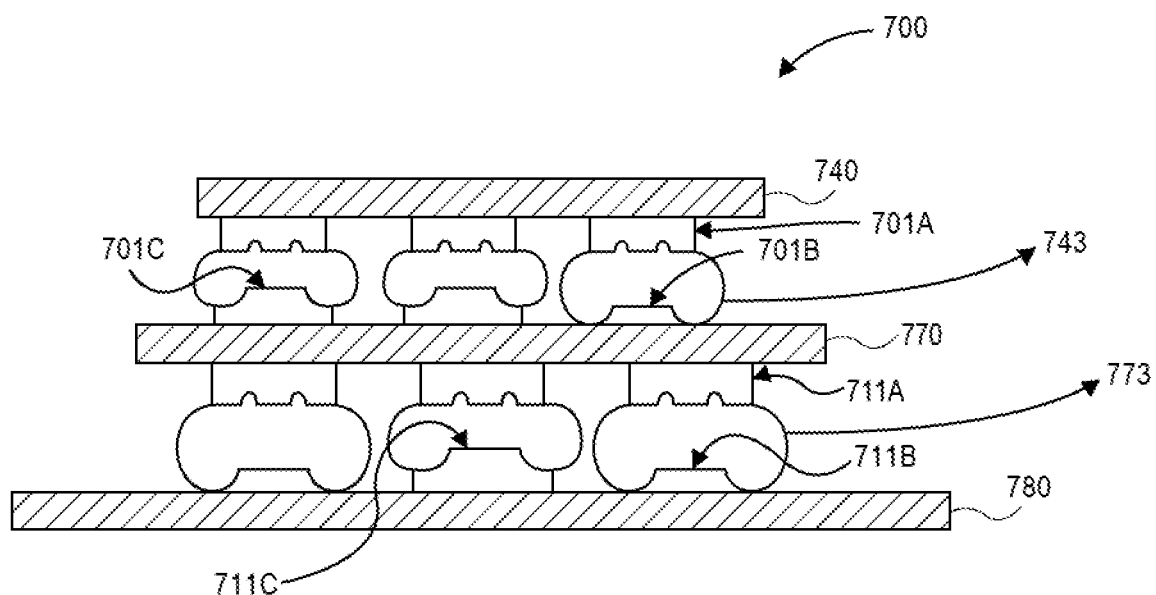
FIG. 7 illustrates a cross-sectional illustration of a packaged system, according to an embodiment.

Referring now to FIG. 7, which illustrates a cross-sectional view of a packaged system 700 comprised of interconnect structures 701A-C and 711A-C that each include pad having micro features formed therein, in accordance with an embodiment. In an embodiment, the packaged system 700 may include a semiconductor die 740 electrically coupled to a package substrate 770 with solder bumps 743 and interconnect structures 701A-C. For additional embodiments, the semiconductor die 740 may be electrically coupled to the package substrate 770 with a combination of interconnect structures 701A-C and any other suitable interconnect architecture, such as wire bonding or the like. The package substrate 770 may be electrically coupled to a board, such as a printed circuit board (PCB) 780, with solder bumps 773 and interconnect structures 711A-C. For additional embodiments, the package substrate 770 may be electrically coupled to a board, such as the PCB 780, with a combination of interconnect structures 711A-C and any other suitable interconnect architecture, such as wire bonding or the like. Each of the interconnect structures 701A-C and 711A-C can be similar to or the same as one or more of the interconnect structures described above in connection with FIGS. 1A-6B.

In one embodiment, the solder bumps 743 and 773 are used together with the interconnect structures 701A-C and 711A-C to form interconnect joints. Embodiments of interconnect structures and interconnect joints are described above in connection with one or more of FIGS. 1A-6B. In an embodiment, one or more the interconnect structures 701A-C and 711A-C formed based on one or more of the embodiments described above may be integrated on or into: (i) the package substrate 770; (ii) the board 780; (iii) the semiconductor die 740; or (iv) any combination thereof. Embodiments include any number of one or more the interconnect structures 701A-C and 711A-C formed on or into the semiconductor die 740, the package substrate 770, and/or the board 780. For example, a plurality of one or more interconnect structures 701A-C and 711A-C may be integrated—for permanently coupling two components or any other desired use—on or into: (i) the package substrate 770; (ii) the board 780; (iii) the semiconductor die 740; or (iv) any combination thereof.

Figure 8:
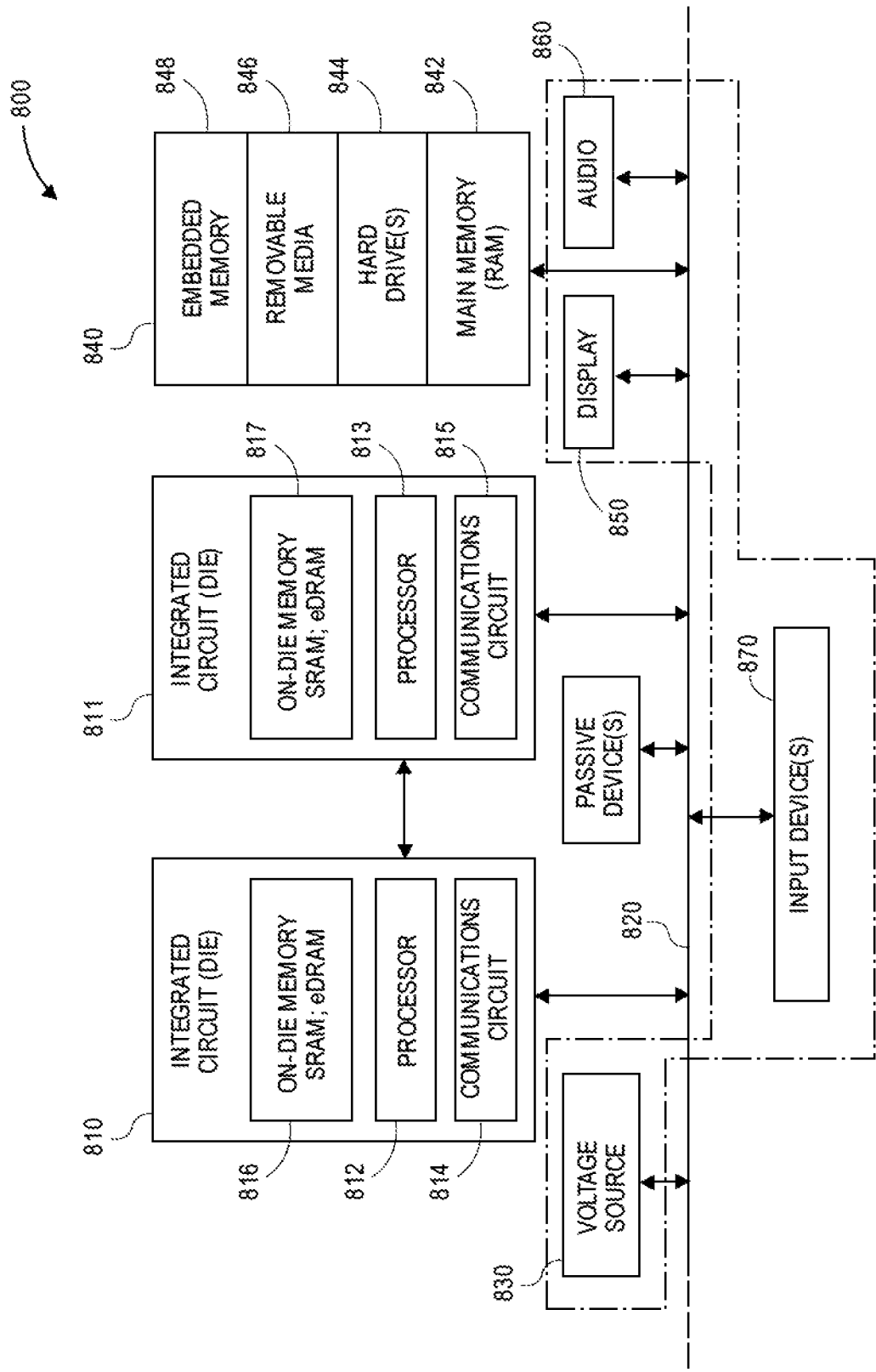
FIG. 8 is an illustration of a schematic block diagram of a computer system, according to an embodiment.

FIG. 8 illustrates a schematic of computer system 800 according to an embodiment. The computer system 800 (also referred to as an electronic system 800) can include interconnect structures formed thereon or therein in accord with any of the embodiments and their equivalents as set forth in this disclosure. The computer system 800 may be a mobile device, a netbook computer, a wireless smart phone, a desktop computer, a hand-held reader, a server system, a supercomputer, or a high-performance computing system.

The system 800 can be a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In one embodiment, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812. As used herein, the processor 812 may mean any type of circuit such as, but not limited to, a microprocessor, a microcontroller, a graphics processor, a digital signal processor, or another processor. In an embodiment, the processor 812 includes, or is coupled with, a semiconductor package comprising interconnect structures formed thereon or therein in accordance with any of the embodiments and their equivalents, as described in the foregoing specification. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM). In one embodiment, the on-die memory 816 may be packaged with a process in accord with any of the embodiments and their equivalents, as described in the foregoing specification.

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850 and an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

At least one of the integrated circuits 810 or 811 can be implemented in a number of different embodiments, including a semiconductor package comprising interconnect structures formed thereon or therein as described herein, an electronic system, a computer system, one or more methods of fabricating an integrated circuit, and one or more methods of fabricating an electronic assembly that includes interconnect structures formed thereon or therein, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the semiconductor package comprising interconnect structures formed thereon or therein in accordance with any of the disclosed embodiments as set forth herein and their art-recognized equivalents. A foundation substrate may be included, as represented by the dashed line of FIG. 8. Passive devices may also be included, as is also depicted in FIG. 8.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "In an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

In the foregoing description, the metal pad of an interconnect structure is described as having a curved profile or a stepped profile. It is to be appreciated that other profiles (not shown) may be used and that any combination of profiles may be used.

Embodiments described herein include an interconnect structure, comprising: a substrate; and a metal pad over the substrate, the metal pad having a first surface and a second surface opposite the first surface, wherein a micro feature is formed in the first surface.

Additional embodiments include an interconnect structure, wherein the micro feature is formed away from an edge of the metal pad.

Additional embodiments include an interconnect structure, further comprising a solder mask, wherein the solder mask comprises an opening that exposes the first surface of the metal pad.

Additional embodiments include an interconnect structure, wherein the micro feature is under the opening proximate to an interface between the solder mask and the metal pad.

Additional embodiments include an interconnect structure, wherein the substrate is a semiconductor package.

Additional embodiments include an interconnect structure, wherein the micro feature is formed in an edge of the metal pad.

Additional embodiments include an interconnect structure, wherein the micro feature is formed through the first surface and extends to the second surface.

Additional embodiments include an interconnect structure, wherein the substrate is a printed circuit board.

Additional embodiments include an interconnect structure, further comprising an interconnect joint on the metal pad, wherein the interconnect joint conforms to a profile of the micro feature.

Additional embodiments include an interconnect structure, wherein the micro feature is in contact with the substrate.

Additional embodiments include an interconnect structure, wherein the micro feature fails to be in contact with the substrate.

Embodiments described herein include an interconnect structure, comprising: a first substrate; a first metal pad on the first substrate, the first metal pad having a first surface and a second surface opposite the first surface, wherein a first micro feature is formed in the first surface of the first metal pad; a second substrate; a second metal pad on the second substrate, the second metal pad having a first surface and a second surface opposite the first surface, wherein a second micro feature is formed in the first surface of the second metal pad; and an interconnect joint between the first metal pad and the second metal pad, the interconnect joint coupling the first and second substrates to each other, wherein the interconnect joint conforms to a profile of the first micro feature and the second micro feature.

Additional embodiments include an interconnect structure, wherein the micro feature is formed away from an edge of the metal pad.

Additional embodiments include an interconnect structure, further comprising a solder mask, wherein the solder mask comprises an opening that exposes the first surface of the second metal pad.

Additional embodiments include an interconnect structure, wherein the second micro feature is under the opening proximate to an interface between the solder mask and the second metal pad.

Additional embodiments include an interconnect structure, wherein the second substrate is a semiconductor package.

Additional embodiments include an interconnect structure, wherein the first micro feature is formed in an edge of the first metal pad.

Additional embodiments include an interconnect structure, wherein the first micro feature is formed through the first surface and extends to the second surface of the first metal pad.

Additional embodiments include an interconnect structure, wherein the first substrate is a printed circuit board.

Additional embodiments include an interconnect structure, wherein the micro feature is in contact with the substrate.

Additional embodiments include an interconnect structure, wherein the micro feature fails to be in contact with the substrate.

Embodiments described herein include a method, comprising: depositing a metallic material on a substrate; and patterning the metallic material to fabricate a metal pad over the substrate, the metal pad having a first surface and a second surface opposite the first surface, wherein a micro feature is formed in the first surface.

Additional embodiments include a method, wherein patterning the metallic material comprises etching the metallic material.

Additional embodiments include a method, wherein etching the metallic material comprises laser etching the metallic material.

Additional embodiments include a method, wherein the micro feature extends to the second surface.

The invention claimed is:

1. An interconnect structure, comprising:
   a substrate; and
   a metal pad over the substrate, the metal pad having a first surface and a second surface opposite the first surface, wherein a micro feature is formed in the first surface, wherein the micro feature comprises a recess in the first surface, and wherein the micro feature comprises a curved surface.

2. The interconnect structure of claim 1, wherein the micro feature is formed away from an edge of the metal pad.

3. The interconnect structure of claim 1, further comprising a solder mask, wherein the solder mask comprises an opening that exposes the first surface of the metal pad.

4. The interconnect structure of claim 3, wherein the micro feature is under the opening proximate to an interface between the solder mask and the metal pad.

5. The interconnect structure of claim 3, wherein the substrate is a semiconductor package.

6. The interconnect structure of claim 1, wherein the micro feature is formed in an edge of the metal pad.

7. The interconnect structure of claim 6, wherein the micro feature is formed through the first surface and extends to the second surface.

8. The interconnect structure of claim 6, wherein the substrate is a printed circuit board.

9. The interconnect structure of claim 1, further comprising an interconnect joint on the metal pad, wherein the interconnect joint conforms to a profile of the micro feature.

10. The interconnect structure of claim 1, wherein the micro feature is in contact with the substrate.

11. The interconnect structure of claim 1, wherein the micro feature fails to be in contact with the substrate.

12. An interconnect structure, comprising:
    a first substrate;
    a first metal pad on the first substrate, the first metal pad having a first surface and a second surface opposite the first surface, wherein a first micro feature is formed in the first surface of the first metal pad;
    a second substrate;
    a second metal pad on the second substrate, the second metal pad having a first surface and a second surface opposite the first surface, wherein a second micro feature is formed in the first surface of the second metal pad; and
    an interconnect joint between the first metal pad and the second metal pad, the interconnect joint coupling the first and second substrates to each other, wherein the interconnect joint conforms to a profile of the first micro feature and the second micro feature.

13. The interconnect structure of claim 12, wherein the micro feature is formed away from an edge of the metal pad.

14. The interconnect structure of claim 12, further comprising a solder mask, wherein the solder mask comprises an opening that exposes the first surface of the second metal pad.

15. The interconnect structure of claim 14, wherein the second micro feature is under the opening proximate to an interface between the solder mask and the second metal pad.

16. The interconnect structure of claim 14, wherein the second substrate is a semiconductor package.

17. The interconnect structure of claim 12, wherein the first micro feature is formed in an edge of the first metal pad.

18. The interconnect structure of claim 17, wherein the first micro feature is formed through the first surface and extends to the second surface of the first metal pad.

19. The interconnect structure of claim 17, wherein the first substrate is a printed circuit board.

20. The interconnect structure of claim 12, wherein the micro feature is in contact with the substrate.

21. The interconnect structure of claim 12, wherein the micro feature fails to be in contact with the substrate.

22. An interconnect structure, comprising:
    a substrate; and
    a metal pad over the substrate, the metal pad having a first surface and a second surface opposite the first surface, wherein a micro feature is formed in the first surface, wherein the micro feature is formed in an edge of the metal pad, and wherein the micro feature comprises a curved surface.

23. The interconnect structure of claim 22, wherein the micro feature is formed through the first surface and extends to the second surface.

24. The interconnect structure of claim 22, wherein the substrate is a printed circuit board.

25. An interconnect structure, comprising:
    a substrate; and
    a metal pad over the substrate, the metal pad having a first surface and a second surface opposite the first surface, wherein a micro feature is formed in the first surface, wherein the micro feature is in contact with the substrate, and wherein the micro feature comprises a curved surface.

* * * * *